(12) United States Patent
Katabe

(10) Patent No.: US 7,728,970 B2
(45) Date of Patent: Jun. 1, 2010

(54) METHOD FOR DETERMINING MIXTURE COMPOSITION OF FLUORESCENT MATERIALS AND METHOD FOR MANUFACTURING LIGHT-EMITTING DEVICE

(75) Inventor: Kousuke Katabe, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 318 days.

(21) Appl. No.: 11/928,822

(22) Filed: Oct. 30, 2007

(65) Prior Publication Data

US 2008/0106734 A1    May 8, 2008

(30) Foreign Application Priority Data

Oct. 30, 2006 (JP) ............................. 2006-293990

(51) Int. Cl.
  *G01J 3/30* (2006.01)
  *H01L 33/00* (2010.01)
(52) U.S. Cl. .................. 356/300; 356/402; 356/425
(58) Field of Classification Search ................. 356/417, 356/425
  See application file for complete search history.

(56) References Cited

U.S. PATENT DOCUMENTS

2006/0208262 A1* 9/2006 Sakuma et al. ................. 257/79

* cited by examiner

*Primary Examiner*—F. L Evans
(74) *Attorney, Agent, or Firm*—Stephen C. Beuerle; Procopio, Cory, Hargreaves & Savitch LLP

(57) ABSTRACT

A method for determining a mixture composition of a plurality of fluorescent materials includes steps of calculating a first function, calculating a second function and determining a secondary mixture composition of the plurality of fluorescent materials. The first function is calculated by comparing an objective spectrum of an objective light with a reference spectrum of a reference light. The second function is calculated by comparing a primary spectrum of the plurality of fluorescent materials mixed at a primary mixture with the reference spectrum composition. The secondary mixture composition is determined on the basis of the result of comparison between the first function and the second function.

16 Claims, 10 Drawing Sheets

METHOD FOR DETERMINING MIXTURE COMPOSITION OF FLUORESCENT MATERIALS AND METHOD FOR MANUFACTURING LIGHT-EMITTING DEVICE

CROSS-REFERENCE TO RELATED APPLICATIONS

The present application claims priority to Japanese Patent Application No. 2006-293990, filed on Oct. 30, 2006. The contents of this application are incorporated herein by reference in its entirety.

BACKGROUND OF THE INVENTION

1. Field of the Invention

The present invention relates to a method for determining a mixture composition of fluorescent materials and a method for manufacturing a light-emitting device including fluorescent materials.

2. Description of the Related Art

Recently, in the field of, for example, illumination, a light-emitting device including a light-emitting chip, such as a light-emitting diode, has been developed. In general, the light-emitting chip used in the field of illumination emits blue light or ultraviolet light. A light emitter capable of converting the wavelength of light emitted from the light-emitting chip has been developed to achieve light desired by users (objective light). The light emitter includes a plurality of fluorescent materials that are excited by light emitted from the light-emitting chip.

SUMMARY OF THE INVENTION

According to an aspect of the present invention, a method for determining a mixture composition of a plurality of fluorescent materials includes the steps of calculating a first function, calculating a second function and determining a secondary mixture composition of the plurality of fluorescent materials. The first function is calculated by comparing an objective spectrum of an objective light with a reference spectrum of a reference light. The second function is calculated by comparing a primary spectrum of the plurality of fluorescent materials mixed at a primary mixture with the reference spectrum composition. The secondary mixture composition is determined on the basis of the result of comparison between the first function and the second function.

According to another aspect of the present invention, a method for manufacturing a light-emitting device including a light-emitting chip made of a semiconductor material includes the steps of determining a secondary mixture composition of a plurality of fluorescent materials, preparing a light emitter, mounting the light-emitting chip on a base and placing the light emitter on or above the light-emitting chip. The secondary mixture composition is determined on the basis of a first function and a second function. The first function denotes the relative relationship between a reference light and an objective light. The second function denotes the relative relationship between the reference light and a light emitted from the plurality of fluorescent materials mixed at a primary mixture composition. The light emitter includes the plurality of fluorescent materials mixed on the basis of the secondary mixture composition.

DESCRIPTION OF THE PREFERRED EMBODIMENT

Figure 1:
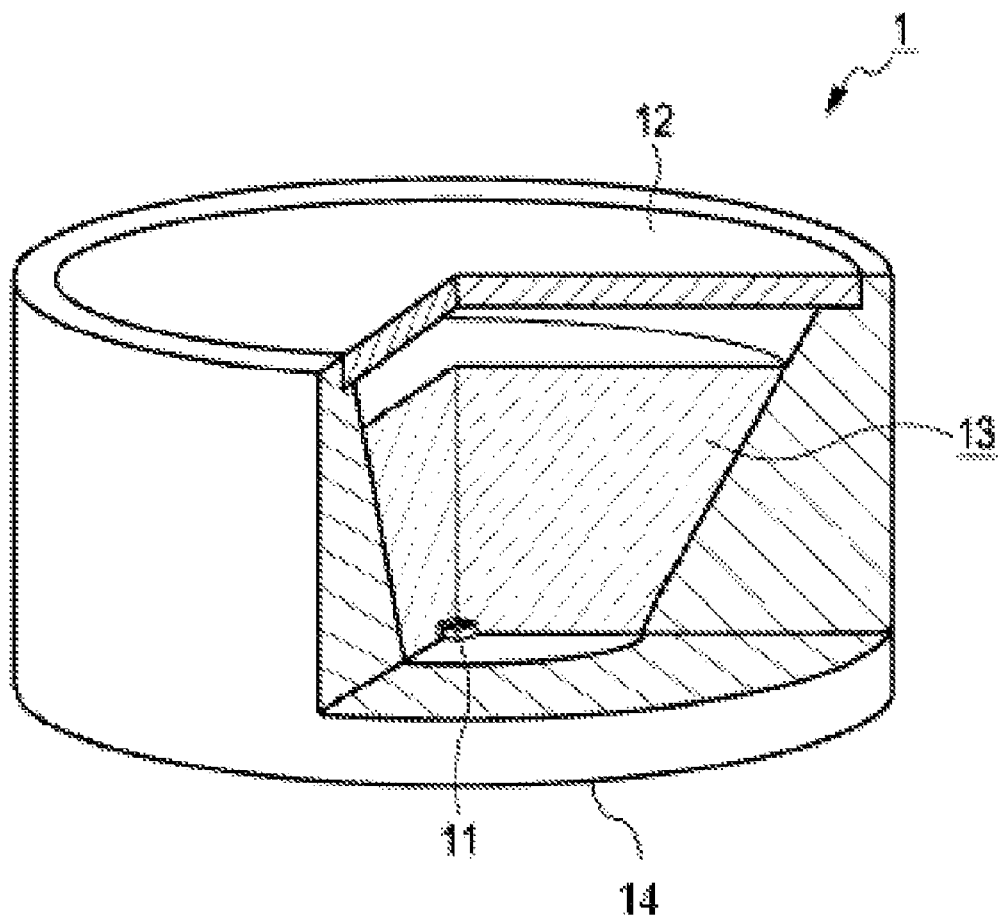
FIG. 1 is a perspective view of a light-emitting device manufactured by a method according to an embodiment of the present invention.
Figure 2:
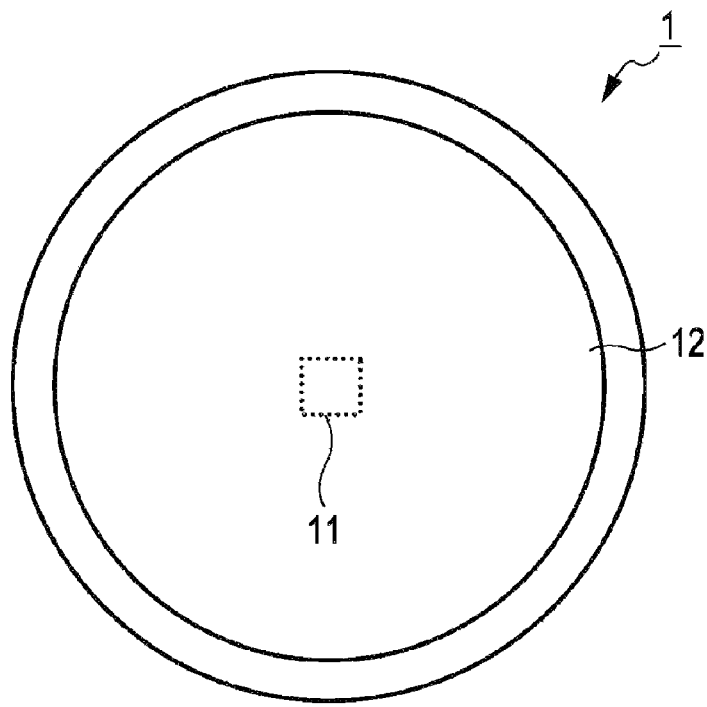
FIG. 2 is a plan view of the light-emitting device illustrated in FIG. 1.
Figure 3:
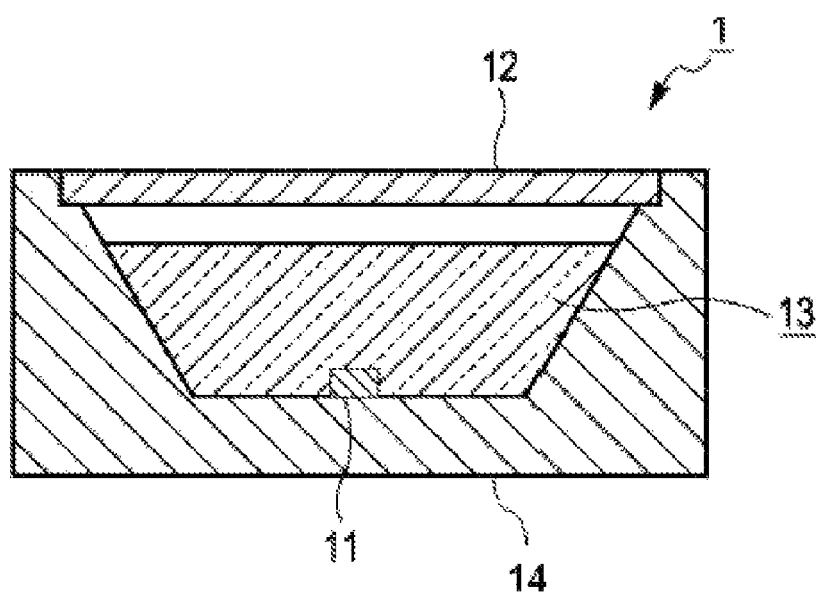
FIG. 3 is a sectional view of the light-emitting device illustrated in FIG. 1.

An embodiment of the present invention will be described below with reference to the drawings. As illustrated in FIGS. 1 to 3, a light-emitting device 1 obtained by a manufacturing method according to the present embodiment has a light-emitting chip 11 and a light emitter 12. The light-emitting chip 11 is a light-emitting diode made of a semiconductor material. The light emitter 12 includes a plurality of fluorescent materials being excited by a light emitted from the light-emitting chip 11. The light-emitting device 1 further has a transparent material layer 13 in which the light-emitting chip 11 is encapsulated.

Figure 4:
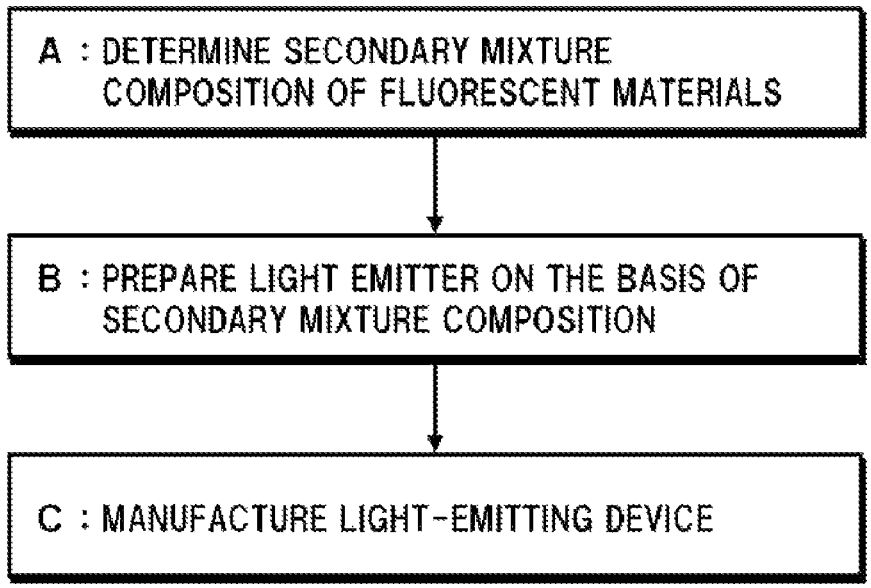
FIG. 4 is a diagram illustrating a method for manufacturing the light-emitting device according to the embodiment.

Referring to FIG. 4, the manufacturing method according to the present embodiment includes Steps A to C. In Step A, a secondary mixture composition of the fluorescent materials is determined. In Step B, the light emitter 12 is prepared on the basis of the secondary mixture composition. The plurality of fluorescence materials is mixed on the basis of the secondary mixture composition. The plurality of fluorescence materials mixed on the basis of the secondary mixture composition is put in a transparent material. The transparent material is silicone resin. In Step C, the light-emitting device 1 having the light emitter 12 is manufactured. The light-emitting chip 11 is mounted on a base. The light emitter 12 is placed on or above the light-emitting chip 11.

Figure 5:
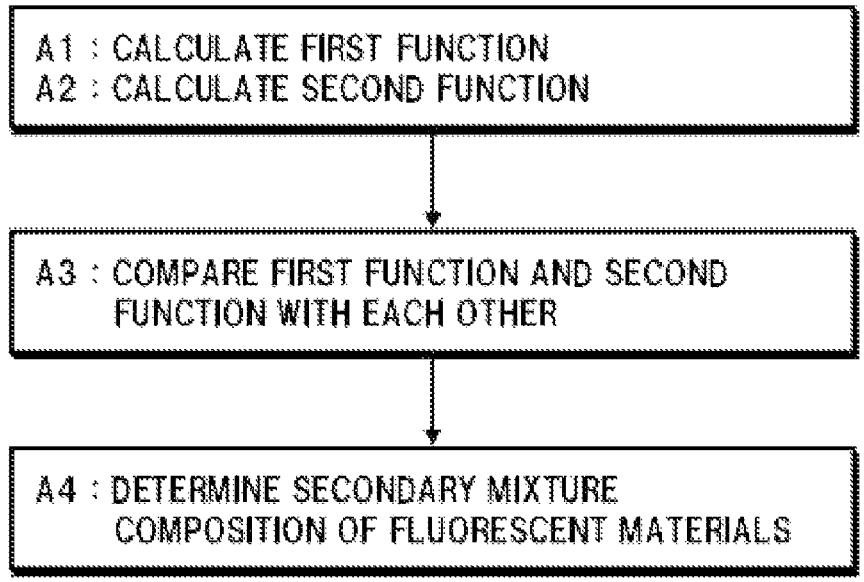
FIG. 5 is a diagram illustrating a method for determining a second mixture composition of fluorescent materials according to the embodiment.

In Step A, the secondary mixture composition of the fluorescent materials is determined on the basis of a first function and a second function. The first function is determined on the basis of the relationship between a reference light and an objective light. The second function is determined on the basis of the relationship between the reference light and a light emitted from the fluorescent materials mixed at a primary mixture composition. In the present embodiment, "reference light" functions as a reference with respect to the objective light and the light emitted from the fluorescent materials. In addition, "objective light" is a design target light. In other words, the objective light corresponds to light desired by a user. As illustrated in FIG. 5, Step A illustrated in FIG. 4 includes the following Steps A1 to A4:

Step A1: calculating the first function;
Step A2: calculating the second function;
Step A3: comparing the first function and the second function with each other; and
Step A4: determining the secondary mixture composition of the fluorescent materials.

The first function denotes the relationship between the reference light and the objective light. The first function is expressed as a function based on a plurality of test colors and calculated values of light intensities. The first function is obtained by the following Steps 11 to 13. In step 11, a first plurality of light intensities Sr(T) is calculated. The first plurality of light intensities Sr(T) corresponds to a plurality of test colors T1 to Tn (2≦n), in the reference light. The first plurality of light intensities Sr(T) comprises Sr(T1), Sr(T2), . . . , Sr(Tn−1) and Sr(Tn). The first plurality of light intensities Sr(T) is calculated by a method of specifying color rendering properties.

In step 12, a second plurality of light intensities Sb(T) is calculated. The second plurality of light intensities corresponds to the test colors T1 to Tn (2≦n), in the objective light. The second plurality of light intensities Sb(T) comprises Sb(T1), Sb(T2), . . . , Sb(Tn−1) and Sb(Tn). The second plurality of light intensities Sb(T) is calculated by the method of specifying color rendering properties.

In step 13, a first plurality of relative values S1(T) is calculated. The first plurality of relative values S1(T) denotes relativity of the calculated values of the second plurality of light intensities Sb(T) with respect to the calculated values of the first plurality of light intensities Sr(T). The first relative values S1(T) comprises S1(T1), S1(T2), . . . , S1(Tn−1) and S1(Tn). The first function is defined by the first plurality of relative values S1(T).

The second function denotes the relationship between the reference light and the light emitted from the fluorescent materials mixed at the primary mixture composition. The second function is expressed as a function based on a plurality of test colors and calculated values of light intensities. The second function is obtained by the following Steps 21 to 23. In step 21, the first plurality of light intensities Sr(T) is calculated. The first plurality of light intensities corresponds to the test colors T1 to Tn (2≦n), in the reference light. The first plurality of light intensities Sr(T) comprises Sr(T1), Sr(T2), . . . , Sr(Tn−1) and Sr(Tn).

In step 22, a third plurality of light intensities Sf(T) is calculated. The third plurality of light intensities Sf(T) corresponds to the test colors T1 to Tn (2≦n), in the light emitted from the fluorescent materials mixed at the primary mixture composition. The third plurality of light intensities Sf(T) comprises Sf(T1), Sf(T2), . . . , Sf(Tn−1) and Sf(Tn). The third plurality of light intensities Sf(T) is calculated by the method of specifying color rendering properties.

In step 23, a second plurality of relative values S2(T) is calculated. The second plurality of relative values S2(T) denotes relativity of the calculated values of the third plurality of light intensities with respect to the calculated values of the first plurality of light intensities. The second plurality of relative values S2(T) comprises S2(T1), S2(T2), . . . , S2(Tn−1) and S2(Tn). The second function is defined by the second plurality of relative values S2(T).

In Steps A3 and A4, the secondary mixture composition of the fluorescent materials is determined on the basis of the result of comparison between the first function S1(T) and the second function S2(T).

Figure 6:
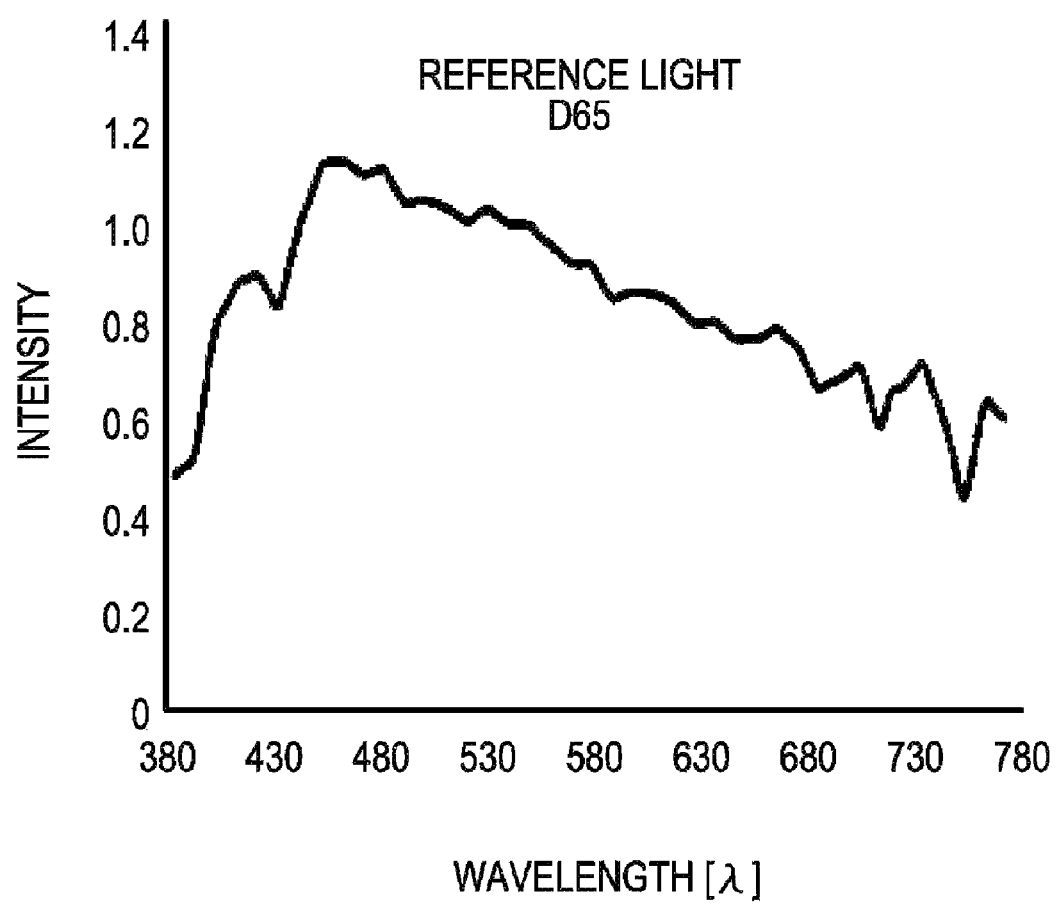
FIG. 6 illustrates a spectrum of reference light.
Figure 7:
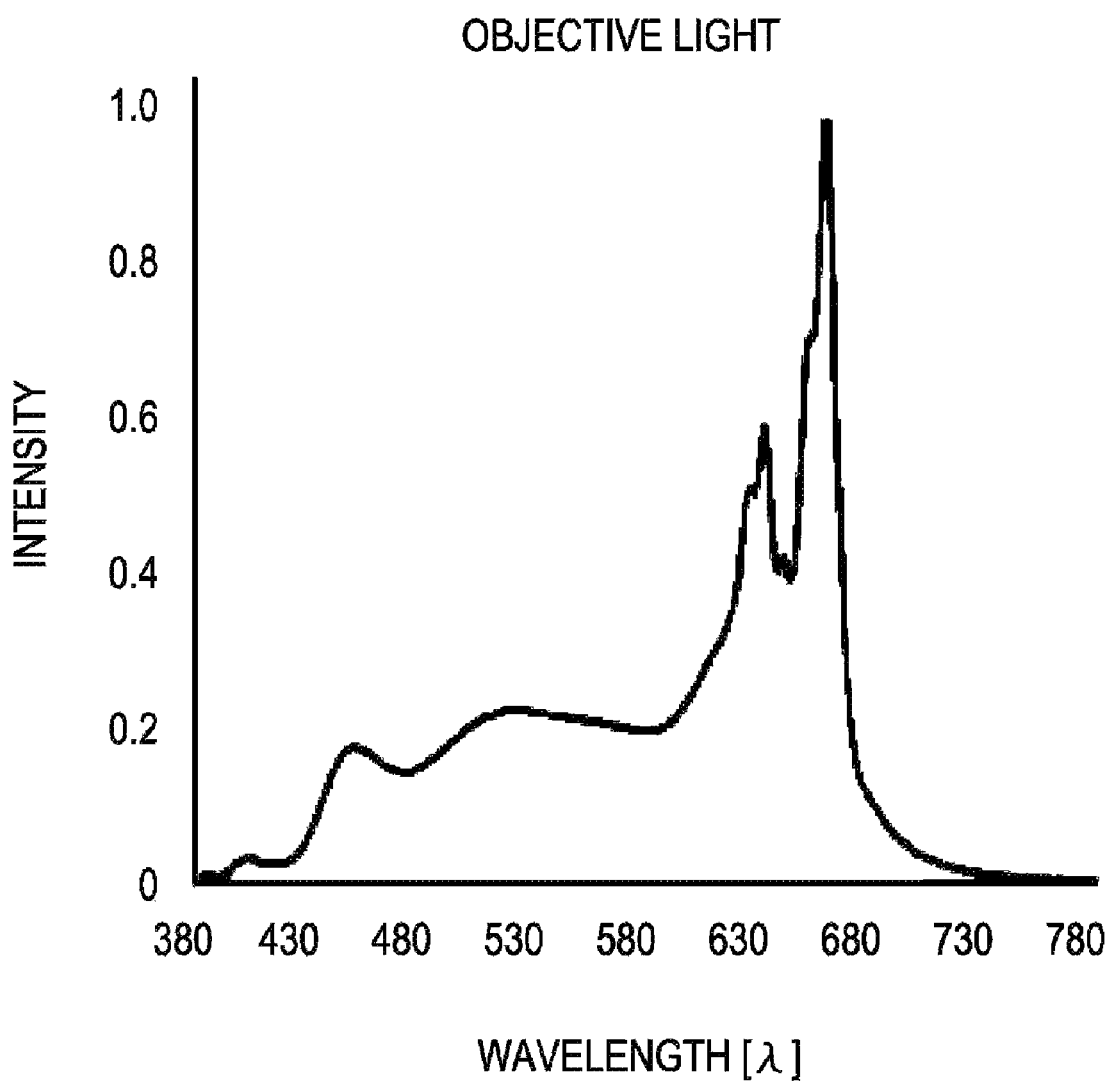
FIG. 7 illustrates a spectrum of objective light.

Examples of Steps A1 to A4 illustrated in FIG. 5 will now be described with reference to FIGS. 6 to 12. Referring to FIG. 6, the reference light is the CIE standard illuminant D65 defined by ISO/CIE 10526. The CIE standard illuminant D65 has a color temperature of 6504 degree Kelvin. Another example of reference light is CIE standard illuminant A defined by ISO/CIE 10526. The CIE standard illuminant A has a color temperature of 2856 degree Kelvin. Another example of reference light is light having a color temperature of 2800 degree Kelvin, which corresponds to the color temperature of incandescent light. The test colors are the fourteen CIE-Munsell samples (R1, R2, . . . , R13, R14). In the present embodiment, the test colors also include the CIE 1974 general color rendering index Ra. The general color rendering index Ra denotes an average value of test colors R1 to R14. The objective spectrum of the objective light is illustrated in FIG. 7.

Figure 8:
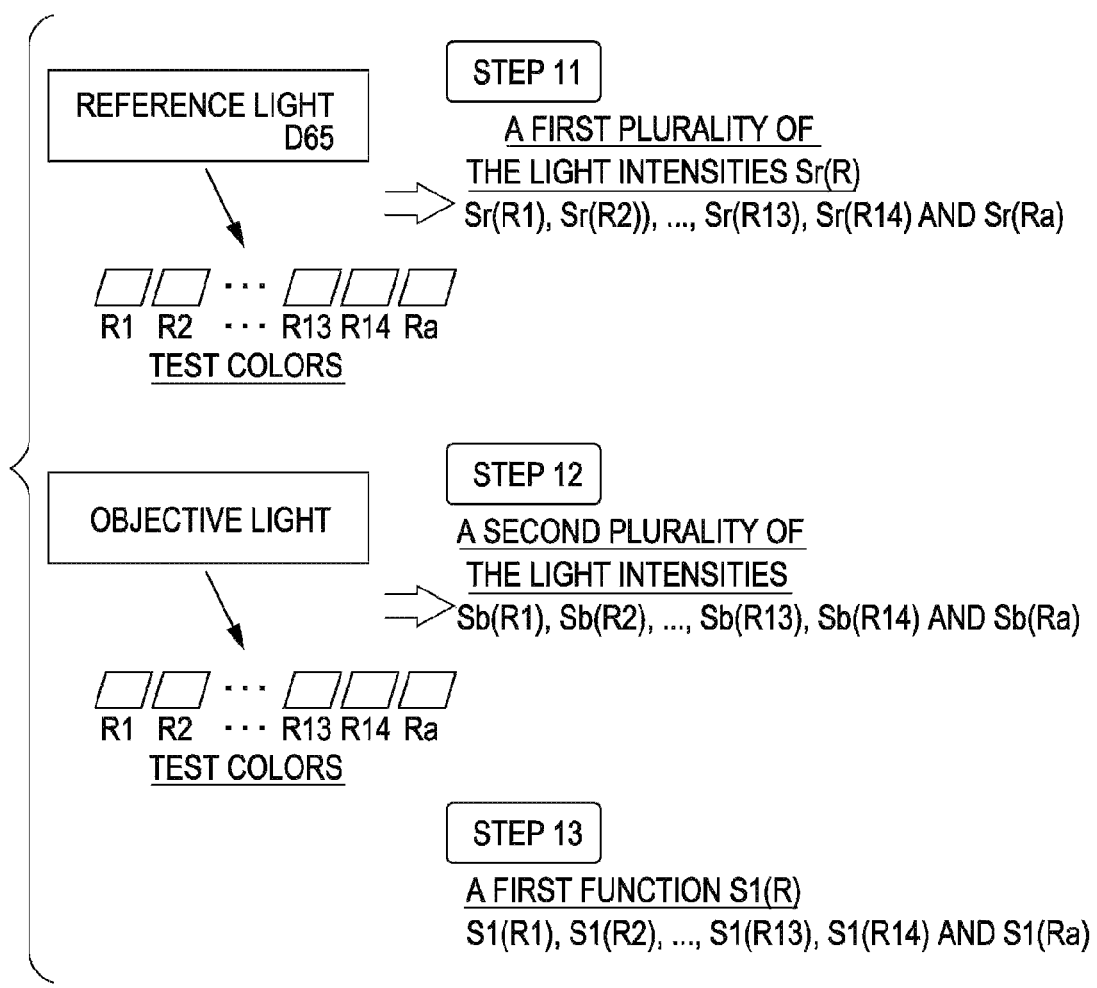
FIG. 8 is a diagram illustrating a process of calculating a first function.

As illustrated in FIG. 8, Step A1 includes the following Steps 11 to 13. In Step 11, a first plurality of light intensities Sr(R) is calculated. The first plurality of light intensities Sr(R) corresponds to a plurality of test colors, in the reference light (D65). The plurality of test colors comprises CIE-Munsell samples (R1, R2, . . . , R13, R14) and general color rendering index Ra. The first plurality of light intensities Sr(R) comprises Sr(R1), Sr(R2), . . . , Sr(R13), Sr(R14) and Sr(Ra). The first plurality of light intensities Sr(R) is calculated by a method of specifying color rendering properties defined by Japanese Industrial Standards (JIS) Z 8726.

In step 12, calculated is a second plurality of light intensities Sb(R) corresponding to the plurality of test colors, in the objective light. The plurality of test colors comprises CIE-Munsell samples (R1, R2, . . . , R13, R14) and general color rendering index Ra. The second plurality of light intensities Sb(R) comprises Sb(R1), Sb(R2), . . . , Sb(R13), Sb(R14) and Sb(Ra). The second plurality of light intensities Sb(R) is calculated by the method of specifying color rendering properties defined by JIS Z 8726.

Figure 9:
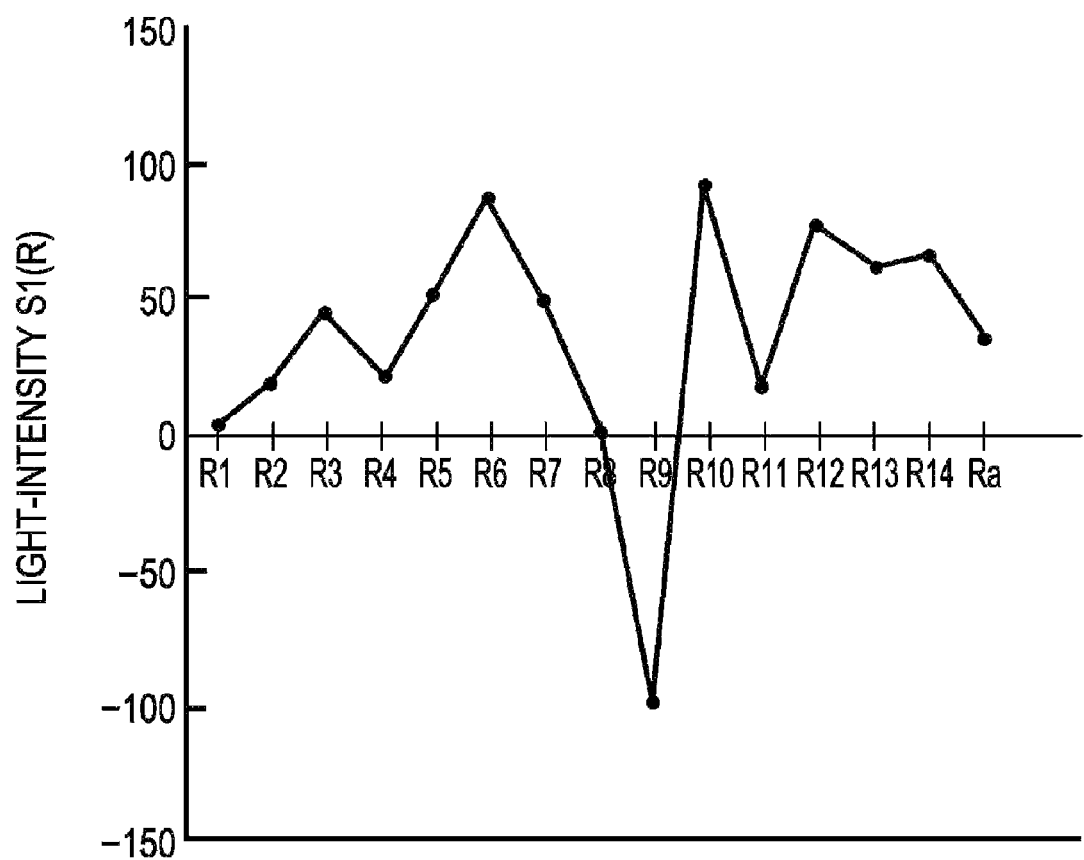
FIG. 9 is a graph of the first function.

In step 13, a first plurality of relative values S1(R) is calculated. The first plurality of relative values denotes relativity of the second plurality of light intensities Sb(R) with respect to the first plurality of light intensities Sr(R). The first plurality of relative values S1(R) comprises S1(R1), S1(R2), . . . , S1(R13), S1(R14) and S1(Ra). The first function is defined by the first plurality of relative values S1(R). FIG. 9 illustrates the first function S1(R).

Figure 10:
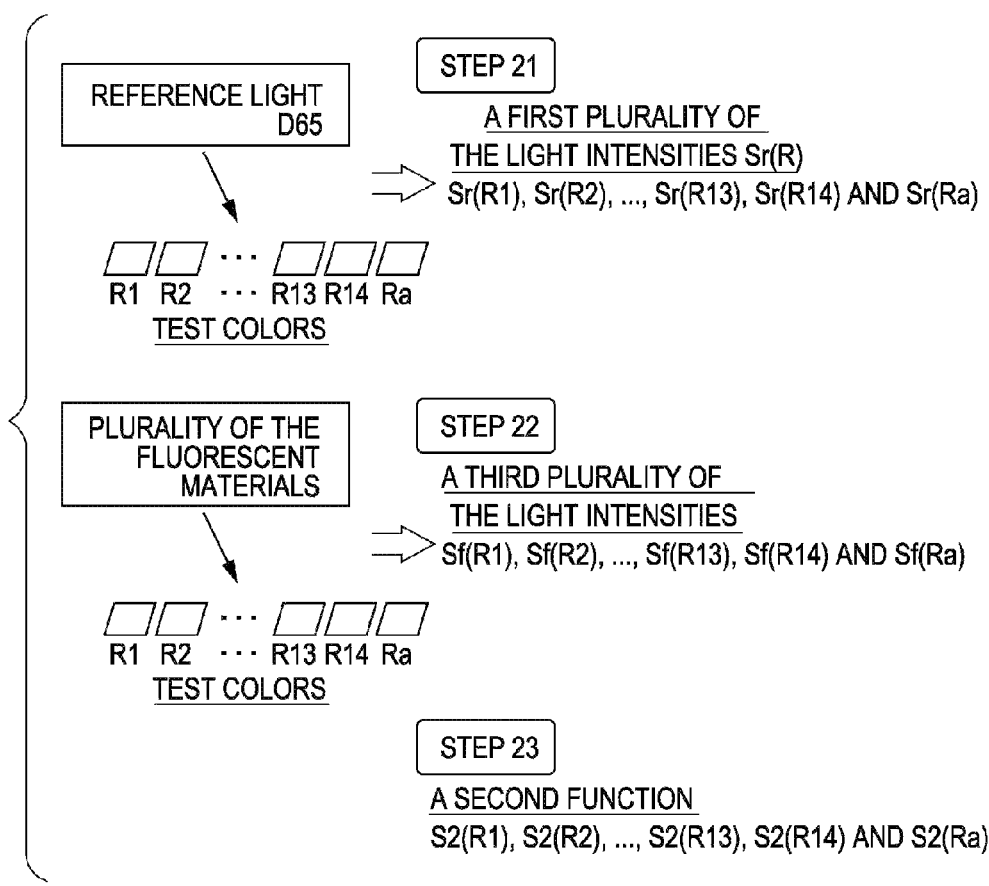
FIG. 10 is a diagram illustrating a process of calculating a second function.

As illustrated in FIG. 10, Step A2 includes the following Steps 21 to 23. In Step 21, the first plurality of light intensities Sr(R) is calculated. The first plurality of light intensities corresponds to the plurality of test colors, in the reference light (D65). The plurality of test colors comprises CIE-Munsell samples (R1, R2, . . . , R13, R14) and general color rendering index Ra. The first plurality of light intensities Sr(R) comprises Sr(R1), Sr(R2), . . . , Sr(R13), Sr(R14) and Sr(Ra). The first plurality of light intensities Sr(R) is calculated by the method of specifying color rendering properties defined by JIS Z 8726.

In Step 22, a third plurality of light intensities Sf(R) is calculated. The third plurality of light intensities corresponds to the plurality of test colors, in the light emitted from the fluorescent materials mixed at the primary mixture composition. The plurality of test colors comprises CIE-Munsell samples (R1, R2, . . . , R13, R14) and general color rendering index Ra. The third plurality of light intensities Sf(R) comprises Sf(R1), Sf(R2), . . . , Sf(R13), Sf(R14) and Sf(Ra).

Figure 11:
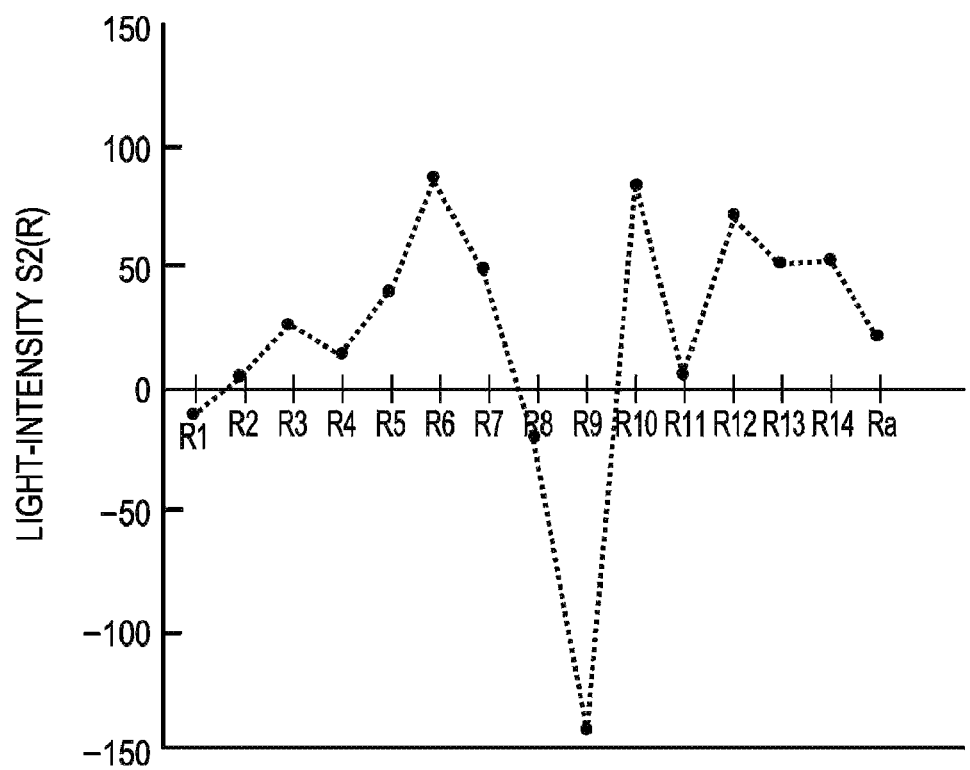
FIG. 11 is a graph of the second function.

In Step 23, a second plurality of relative values S2(R) is calculated. The second plurality of relative values S2(R) denotes relativity of the third plurality of light intensities Sf(R) with respect to the first plurality of light intensities Sr(R). The second plurality of relative values S2(R) comprises S2(R1), S2(R2), ..., S2(R13), S2(R14) and S2(Ra). The second function is defined by the second plurality of relative values S2(R). FIG. 11 illustrates the second function S2(R).

Figure 12:
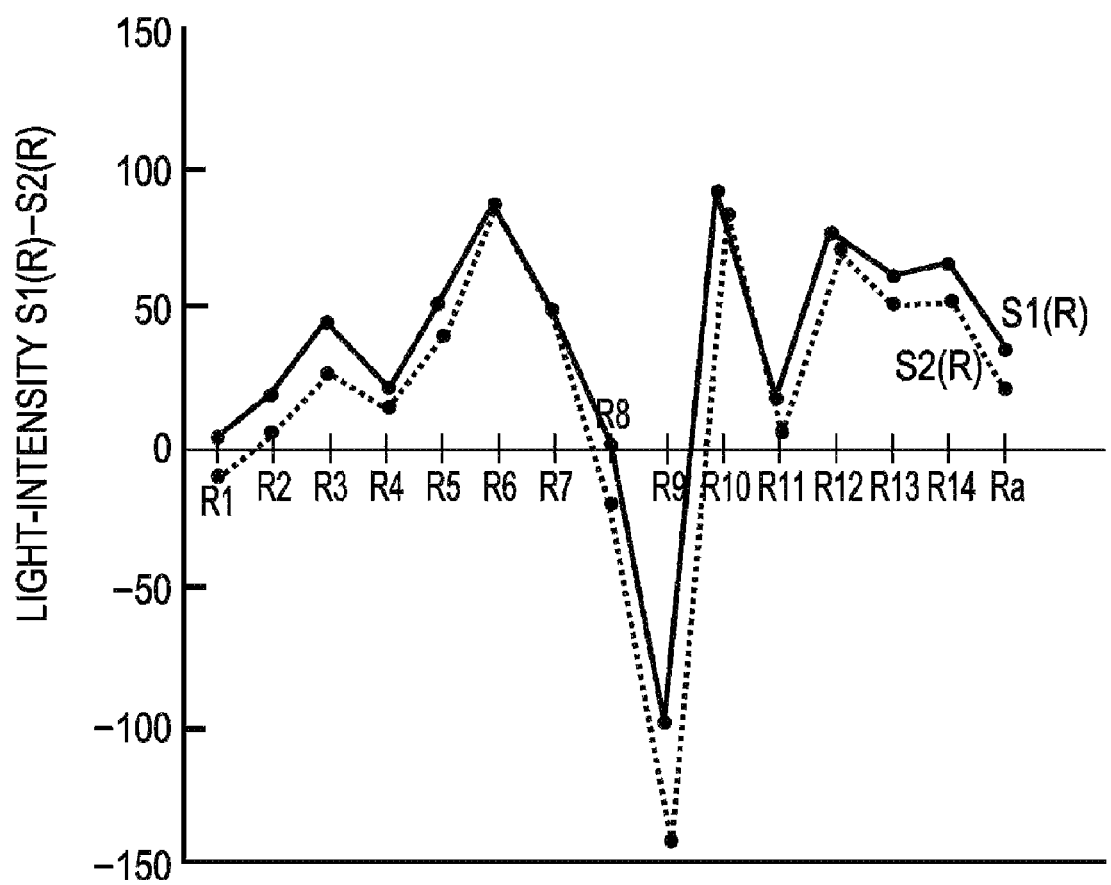
FIG. 12 is a graph in which the first function and the second function are compared with each other.

As illustrated in FIG. 12, in Step A3, the first function and the second function are compared with each other. In Step A4, the secondary mixture composition of the fluorescent materials is determined on the basis of the result of comparison between the first function and the second function (S1(R)-S2(R)). The secondary mixture composition of the fluorescent materials is determined such that the second function S2(R) approximates the first function S1(R).

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

The invention claimed is:

1. A method for manufacturing a light emitter made of a mixture composition of a plurality of fluorescent materials being excited by light emitted from a light-emitting chip made of a semiconductor material, the method comprising:
    calculating a first function by comparing an objective spectrum of an objective light with a reference spectrum of a reference light;
    calculating a second function by comparing a primary spectrum of the plurality of fluorescent materials mixed at a primary mixture composition with the reference spectrum;
    determining a secondary mixture composition of the plurality of fluorescent materials on the basis of the result of comparison between the first function and the second function; and
    preparing a light emitter including the plurality of fluorescent materials on the basis of the secondary mixture composition.

2. The method according to claim 1, wherein the calculating the first function comprises:
    calculating a first plurality of light intensities corresponding to a plurality of test colors, in the reference light; and
    calculating a second plurality of light intensities corresponding to the plurality of test colors, in the objective light.

3. The method according to claim 2, wherein the calculating the first function further comprises calculating a first plurality of relative values of the second plurality of light intensities with respect to the first plurality of light intensities.

4. The method according to claim 3, wherein the calculating the second function comprises calculating a third plurality of light intensities corresponding to the plurality of test colors, in a light emitted from the plurality of fluorescent materials mixed at the primary mixture composition.

5. The method according to claim 4, wherein the calculating the second function further comprises calculating a second plurality of relative values of the third plurality of light intensities with respect to the first plurality of light intensities.

6. The method according to claim 2, wherein the plurality of test colors includes CIE test colors.

7. The method according to claim 6, wherein the plurality of test colors includes the CIE test colors R1 to R8.

8. The method according to claim 2, wherein the plurality of test colors includes a general color rendering index.

9. The method according to claim 2, wherein the first plurality of light intensities and the second plurality of light intensities are calculated by a method of specifying color rendering properties defined by JIS Z 8726.

10. The method according to claim 1, wherein the reference light has a color temperature of 2800 K.

11. The method according to claim 1, wherein the reference light is the CIE standard illuminant D65.

12. A method for manufacturing a light-emitting device including a light-emitting chip made of a semiconductor material, the method comprising:
    determining a secondary mixture composition of a plurality of fluorescent materials on the basis of a first function and a second function, the first function denoting a relative relationship between a reference light and an objective light, the second function denoting a relative relationship between the reference light and a light emitted from the plurality of fluorescent materials mixed at a primary mixture composition;
    preparing a light emitter including the plurality of fluorescent materials on the basis of the secondary mixture composition;
    mounting the light-emitting chip on a base; and
    placing the light emitter on or above the light-emitting chip.

13. The method according to claim 12, wherein the first function is calculated by comparing an objective spectrum of the objective light with a reference spectrum of the reference light.

14. The method according to claim 13, wherein the second function is calculated by comparing a primary spectrum of the plurality of fluorescent materials mixed at a primary mixture composition with the reference spectrum.

15. The method according to claim 12, wherein the preparing the light emitter includes mixing the plurality of fluorescent materials on the basis of the secondary mixture composition.

16. The method according to claim 15, wherein the preparing the light emitter further includes putting the plurality of fluorescent materials mixed on the basis of the secondary mixture composition in a transparent materials.

* * * * *